United States Patent [19]

Sugimura et al.

[11] Patent Number: 4,835,780
[45] Date of Patent: May 30, 1989

[54] SEMICONDUCTOR LASER OUTPUT CONTROL CIRCUIT

[75] Inventors: Keiichi Sugimura, Hanamaki; Yoshinobu Takeyama, Tokyo; Kazuyuki Shimada, Chofu, all of Japan

[73] Assignee: Ricoh Company, Ltd., Tokyo, Japan

[21] Appl. No.: 243,119

[22] Filed: Sep. 7, 1988

Related U.S. Application Data

[63] Continuation of Ser. No. 130,211, Dec. 8, 1987, abandoned.

[30] Foreign Application Priority Data

Dec. 8, 1986 [JP] Japan ............................. 61-291948
Mar. 3, 1987 [JP] Japan ............................. 62-48195

[51] Int. Cl.$^4$ .............................................. H01S 3/13
[52] U.S. Cl. ........................................ 372/29; 372/38
[58] Field of Search ..................... 272/38, 29, 32, 26

[56] References Cited

U.S. PATENT DOCUMENTS

| | | | |
|---|---|---|---|
| 4,329,659 | 5/1982 | Chen | 372/29 |
| 4,412,331 | 11/1983 | Chapman | 372/29 |
| 4,577,320 | 3/1886 | Yoshikawa et al. | 572/29 |
| 4,663,760 | 5/1987 | Shimada et al. | 372/38 |
| 4,689,795 | 8/1987 | Yoshimoto et al. | 372/26 |
| 4,709,370 | 11/1987 | Bednarz et al. | 372/29 |
| 4,763,334 | 8/1988 | Shimada et al. | 372/38 |

Primary Examiner—Léon Scott, Jr.
Attorney, Agent, or Firm—Oblon, Fisher, Spivak, McClelland & Maier

[57] ABSTRACT

A semiconductor laser output control apparatus for controlling a drive current to be supplied to a semiconductor laser which is turned on and off so as to maintain a light output from the semiconductor laser at constant. At the rising edge when the semiconductor laser is turned on, constant current supplied from a constant current source to the semiconductor laser is corrected by correction current.

12 Claims, 18 Drawing Sheets

SEMICONDUCTOR LASER OUTPUT CONTROL CIRCUIT

This application is a continuation of application Ser. No. 130,211, fled on Dec. 8, 1987, now abandoned.

BACKGROUND OF THE INVENTION

1. Field of the Invention

This invention generally relates to a semiconductor laser output control circuit and in particular to such a control circuit for controlling a light output of a semiconductor laser for use in an imaging apparatus, such as a laser beam printer or a laser facsimile machine.

2. Description of the Prior Art

An imaging apparatus, such as a laser beam printer, which uses semiconductor laser as a light source for emitting a light beam carrying image information is well known. In a prior art semiconductor laser output control circuit, the light output of a semiconductor laser is detected by a light detecting circuit and a detected value is compared with a reference value by a comparator, thereby causing an up/down counter to serve as an up counter or down counter to have current flow toward the semiconductor laser in accordance with the count. However, even if the laser driver current is adjusted to be maintained at constant by detecting the light output from the semiconductor laser in this manner, the light output fluctuates due to the so-called thermal coupling, and the light output at the time of light emission from a semiconductor laser (i.e., at the rising edge of an on/off control of a semiconductor laser) rises above a predetermined light output level determined by a laser drive current value and then settles down to the predetermined level after a predetermined time constant. As a result, the light output of the semiconductor laser fluctuates, which could lead to density irregularities in a resulting image if it were used in a laser beam printer as a light source.

Under the circumstances, it has been proposed to supply correction current having a predetermined time constant to a semiconductor laser so as to suppress fluctuations in the output of a semiconductor laser. In accordance with this approach, a modulation signal is integrated to produce a correction signal which is used to correct the laser drive current to be supplied to the semiconductor laser. However, in this correction method using an integrating circuit, since the time constant of such a correction has a relatively large, correction cannot be carried out rapidly and it is not suitable for correction of a short period of time, such as a few micro-seconds or less.

SUMMARY OF THE INVENTION

In accordance with one aspect of the present invention, there is provided a semiconductor laser output control apparatus which comprises a semiconductor laser for emitting a laser light beam. A constant current source is provided as connected in series with the semiconductor laser, and a switching element, which is turned on and off in accordance with a modulation signal, is also provided as connected in parallel with the semiconductor laser. The modulating signal is typically an image signal which carries image information. Also provided is a differentiating circuit for differentiating the modulation signal to produce a differential signal. A current drawing circuit for drawing correction current from the constant current source in proportion to the differential signal is also provided.

In accordance with another aspect of the present invention, there is provided a semiconductor laser output control apparatus for controlling drive current to be supplied to a semiconductor laser so as to maintian a light output from the semiconductor laser at constant by turning the semiconductor laser on and off in accordance with a modulation signal, which comprises correcting means for correcting output fluctuations of the semiconductor laser by supplying correction current of a predetermined time constant to the semiconductor laser at the time when the semiconductor laser is on.

It is therefore a primary object of the present invention to obviate the disadvantages of the prior art as described above and to provide an improved semiconductor lasre outpt control apparatus.

Another object of the present invention is to provide an improved semiconductor laser output control apparatus fast and reliable in operation and simple in structure.

A further object of the present invention is to provide an improved semiconductor laser output control apparatus capable of suppressing light output fluctuations due to thermal coupling of a semiconductor laser even if a time constant is relatively small.

A still further object of the present invention is to provide an improved semiconductor laser output control apparatus capable of correcting fluctuations in a light output of a semiconductor laser.

A still further object of the present invention is to provide an improved semiconductor laser output control apparatus capable of providing a laser light output suitable for use in forming an image.

Other objects, advantages and novel features of the present invention will become apparent from the following detailed description of the invention when considered in conjunction with the accompanying drawings.

DESCRIPTION OF THE PREFERRED EMBODIMENTS

Figure 8:
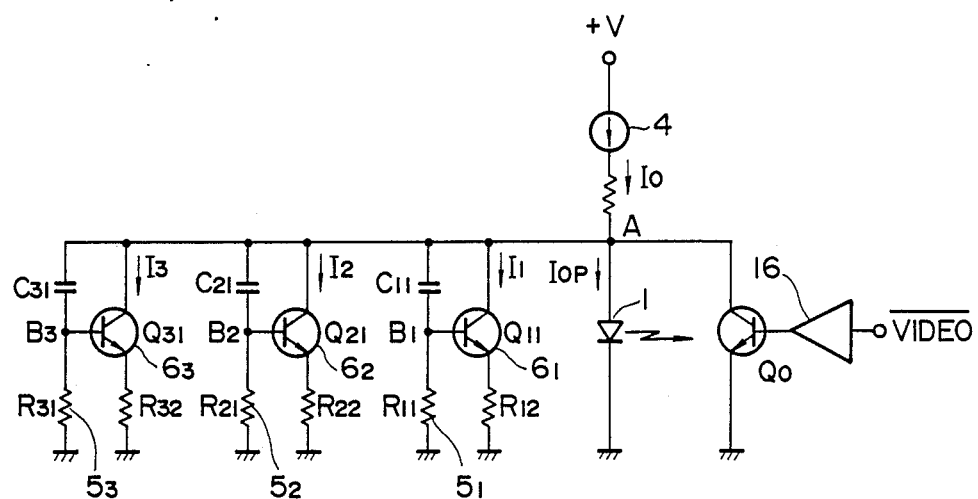
FIG. 8 is circuit diagram showing a specific example of the apparatus shown in FIG. 6.

Referring now to FIGS. 1 through 5, there is schematically shown a semiconductor laser output control apparatus constructed in accordance with one embodiment of the present invention. As shown, there is provided an LD drive circuit 2 for turning a seiconductor laser (LD) 1 on and off in accordanc with a modulation signal, such as a video signal, carrying image information supplied through a phase correction circuit 3. It is to be noted that the LD drive circuit 2 typically includes a transistor $Q_0$ as a switching element and an amplifier 16, as shown in FIG. 8. The semiconductor laser 1 is connected to a constant current source 4 which in turn is connected to a supply voltage +V. And, a differentiating circuit 5 is provided to receive the modulating signal through the phase correction circuit 3, and a current drawing circuit 6 is connected to the differentiating circuit 5 for receiving the differential signal produced by the differentiating circuit 5. Thus, the current drawing circuit 6 operates in accordance with the differential signal supplied from the differentiating circuit 5. The series connection of the differentiating circuit 5 and the current drawing circuit 6 is connected in parallel with the semiconductor laser 1. The current drawing circuit 6 operates to correct output fluctuations of the semiconductor laser 1 by drawing the current from the constant current source 4 supplied to the semiconductor laser 1 at the time when the semiconductor laser 1 is turned on (i.e., at the rising edge) as correction current of a predetermined time constant.

Figure 3A:
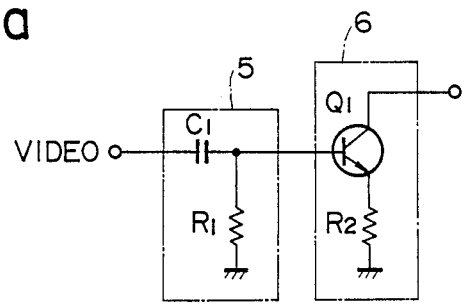
FIGS. 3a through 3c are circuit diagrams showing several examples of a differentiating circuit and a current drawing circuit suitable for use in the apparatus shown in FIG. 1.
Figure 3B:
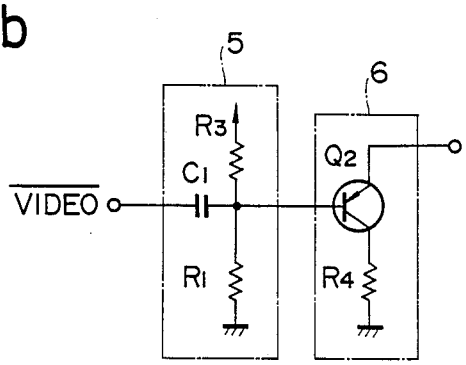
Figure 3C:
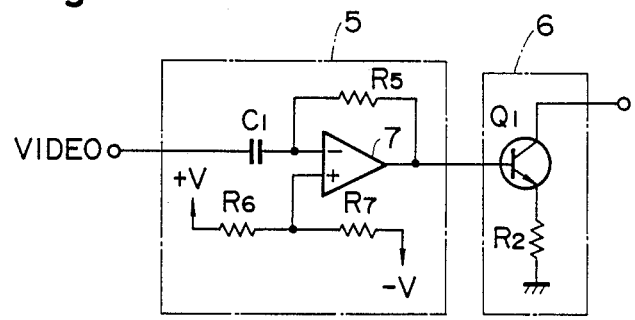

Now. FIGS. 3a through 3c illustrate several examples of a combination of the differentiating circuit 5 and the current drawing circuit 6. In the first place, most typically, as shown in FIG. 3a, the differentiating circuit 5 includes a capacitor $C_1$ and a resistor $R_1$ and receives a video signal VIDEO as a modulating signal, and the current drawing circuit 6 includes an NPN transistor $Q_1$ having an emitter resistance $R_2$. In the case where a video signal $\overline{VIDEO}$ is input as a modulation signal, as shown in FIG. 3b, it may be so structured that the differentiating circuit 5 includes a series connection of resistors $R_1$ and $R_3$ and the current drawing circuit 6 includes a PNP transistor $Q_2$ having a collector resitance $R_4$. Moreover, as shown in FIG. 3c, it may also be so structured that the differentiating circuit 5 includes the capacitor $C_1$, an operational amplifier 7 and resistors $R_5$ through $R_7$. In this case, the current drawing circuit 6 may have the same structure as that shown in FIG. 3a; however, if video signal $\overline{VIDEO}$ is to be input, it may have the PNP structure similarly as shown in FIG. 3b. In the case of FIG. 3c, the ground side of transistor $Q_1$ or $Q_2$ may be changed to -V irrespective of the specific structure of the current drawing circuit 6.

Figure 4A:
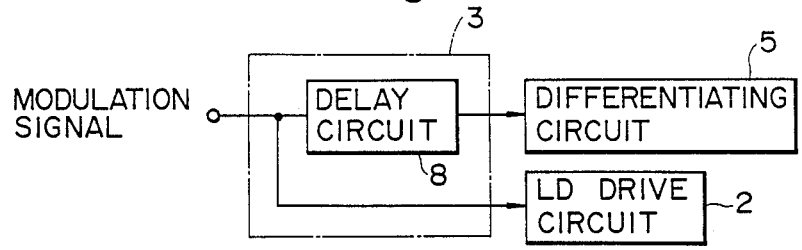
FIGS. 4a through 4d are circuit diagrams showing several examples of a phase correcting circuit suitable for use in the apparatus shown in FIG. 1.
Figure 4B:
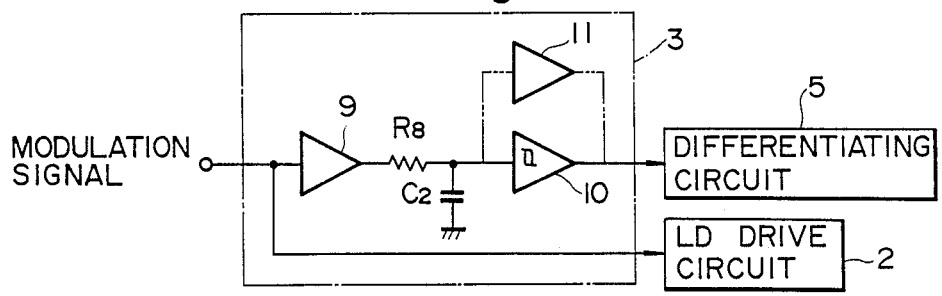
Figure 4C:
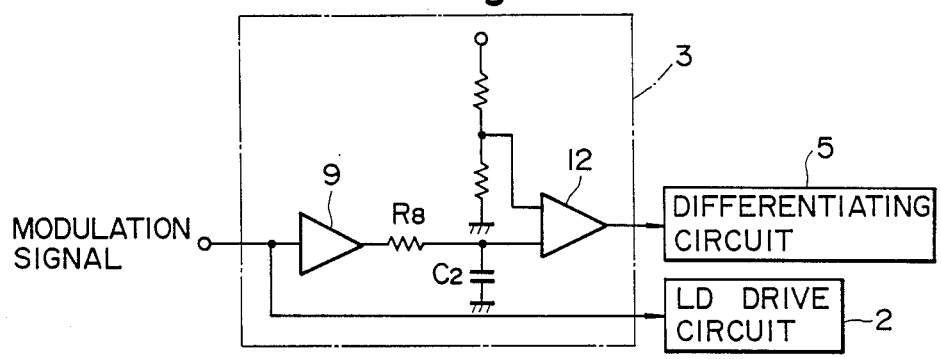
Figure 4D:
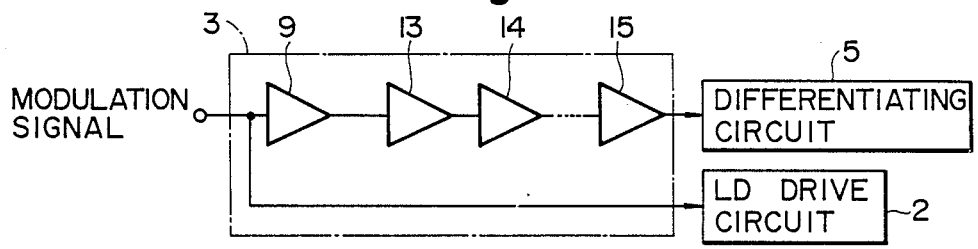

The phase correction circuit 3 has a function to adjust the timing of applying correction to the emission of light from the semiconductor laser 1, and, thus, it is provided only when adjustments in timing are required. Several specific circuit examples of this phase correction circuit 3 are shown in FIGS. 4a through 4d. FIG. 4a shows the simplest example of all, in which a modulation signal is directly input into the LD drive circuit 2 but is input into the differentiating circuit 5 through a delay circuit 8. FIG. 4b shows a structure which includes an open collector type switch circuit 9, a resistor $R_8$, a capacitor $C_2$ and an integrating circuit 10 (or TTL 11) as connected as shown. FIG. 4c shows a modified structure in which the phase correction circuit 3 is constructed by a circuit structure including a comparator 12 in place of the integrating circuit 10. In addition, FIG. 4d shows the structure which includes the switch circuit 9 and a plurality of TTLs 13, 14 and 15.

Figure 1:
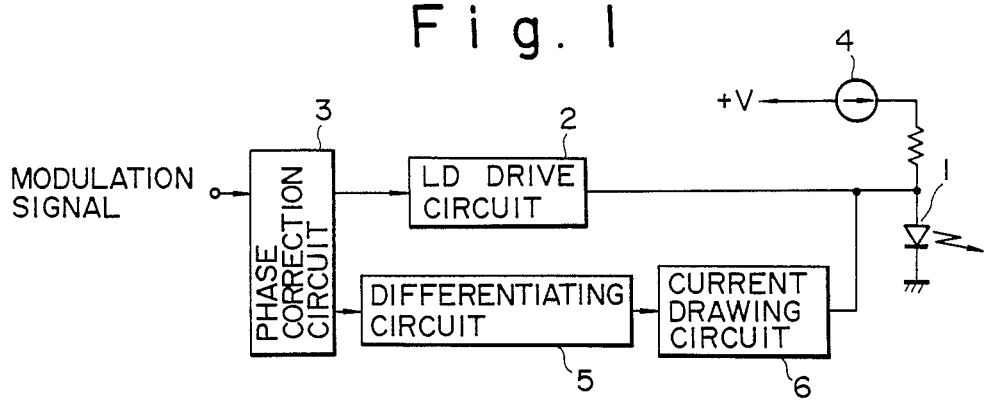
FIG. 1 is a schematic illustration showing a semiconductor laser output control apparatus constructed in accordance with one embodiment of the present invention.
Figure 2A:
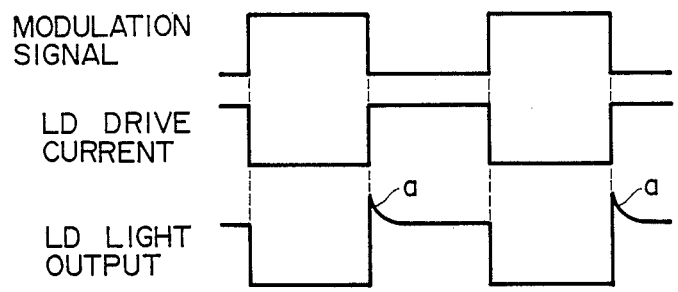
FIGS. 2a and 2b are waveform diagrams which are useful for understanding of the apparatus shown in FIG. 1.
Figure 2B:
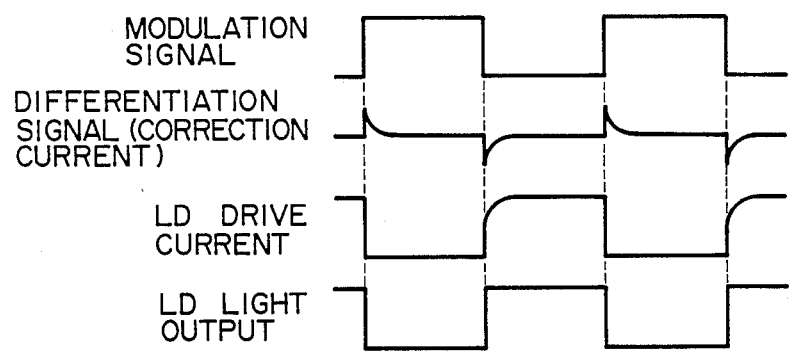

With such structures, considering the case in which no correction is made, there is produced a fluctuation which increases above a constant value of a light output from the semiconductor laser 1 (LD light output) at a rising edge portion a thereof, which is activated by the LD drive current, as shown in FIG. 2a. However, in accordance with the principle of the present invention, since provision is made of the differentiating circuit 5 and the current drawing circuit 6, the modulation signal is first converted into a differential signal shown in FIG. 2 by the differentiating circuit 5. In response to this differential signal thus supplied, the current drawing circuit 6 draws correction current from the constant current source in proportion to the differential signal. In this case, the LD drive circuit 2 is constructed, for example, by a transistor $Q_0$ and one polarity components of the differential signal are cut off, so that the semiconductor laser drive current (LD drive current) will have the waveform such that it is drawn by the current drawing circuit 6 by the amount corresponding to correction current for only the other polarity components of the differential signal, i.e., only when the differential signal rises as shown in FIG. 2b. As a result, the light output of the semiconductor laser 1 (LD light output) comes to be so controlled to reach a predetermined constant level right at the rising edge. With this, fluctuations due to thermal coupling in the light output of the semiconductor laser 1, e.g., fluctuation a indicated in FIG. 2a, come to be suppressed.

Figure 5:
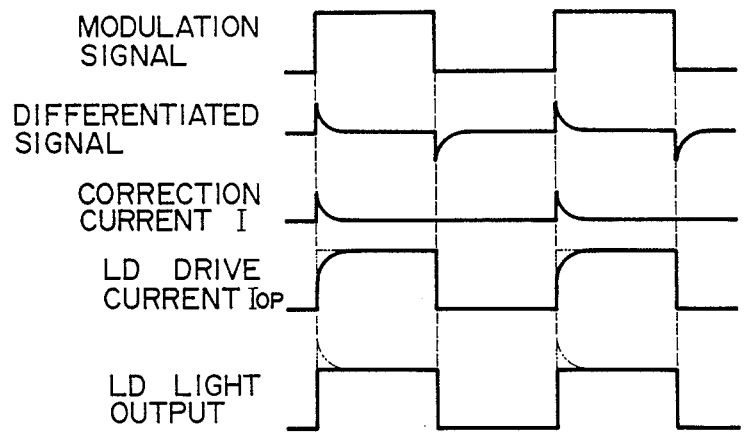
FIG. 5 is a more detailed waveform diagram which is useful for understanding the apparatus shown in FIG. 1.
Figure 6:
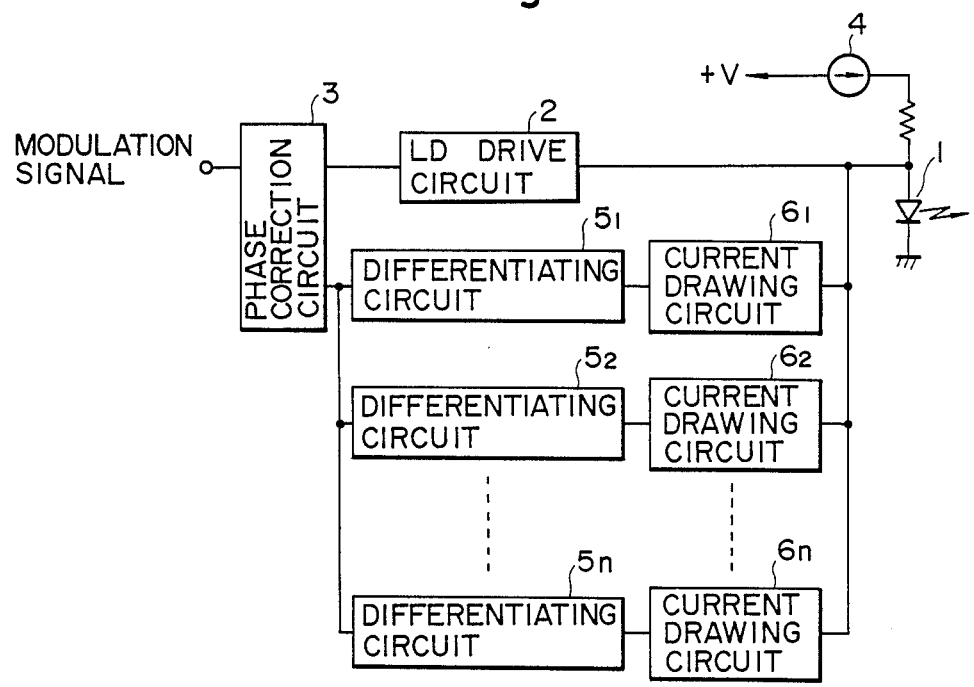
FIG. 6 is a schematic illustration showing a semiconductor laser output control apparatus constructed in accordance with another embodiment of the present invention.

A detailed description will be had for the structure including the differentiating circuit 5 and the current drawing circuit 6 shown in FIG. 3a with reference to the timing chahrt shown in FIG. 5. In the first place, the modulation signal is differentiated by the differentiating circuit 5 to produce a differential signal having a differentiated shape which is determined by a time constant which in turn is determined by the capacitor $C_1$ and the resistor $R_1$. And, by this differential, a base potential is supplied to the base of the transistor $Q_1$ in the current drawing circuit 6. In this manner, when the base potential is supplied, correction current I proportional to the base potential of the transistor $Q_1$ flows between its collector and emitter. In this case, only the positive component in the differential waveform activates the transistor $Q_1$ and the negative component in the differential waveform is cut off by the transistor $Q_1$. As a result, the correction current I flows only in response to the positive component of the differential signal.

The transistor $Q_1$ is connected in parallel with the semiconductor laser 1 but connected in series with the constant current source 4. Thus, designating the LD drive current flowing into the semiconductor laser 1 from the constant current source 4 by Iop, the LD drive current Iop has a value which is determined by subtracting the correction current I flowing into the transistor $Q_1$ from the constant current supplied from the constant current source 4. That is, correction by drawing correction current I is applied to the rising edge of a square-shaped waveform of LD drive current Iop shown in FIG. 5, so that the rising edge of drive current Iop is rounded. As a result, without any correction, there will be produced a fluctuation at the rising edge as a portion indicated by a in the light output of the semiconductor laser (LD light output) as shown in FIG. 2a; however, since the LD drive current Iop at this rising edge is reduced by the differential signal, the resulting LD light output will become constant right from the rising edge as shown in FIG. 5.

Figure 7:
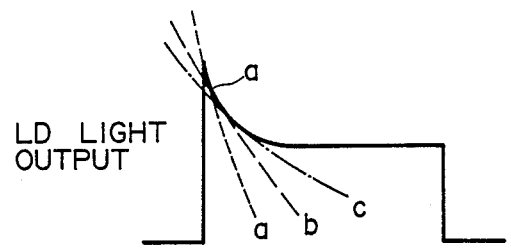
FIG. 7 is a waveform diagram which is useful for understanding the operation of the apparatus shown in FIG. 6.

Now, turning to FIGS. 6 through 10, there is schematically shown a semiconductor laser output control apparatus constructed in accordance with another embodiment of the present invention. In the present embodiment, an n plurality of series connections between the differentiating circuit 5 and the current drawing circuit 6 are provided in parallel, as indicated by subscripts 1 through n. It is to be noted that these differentiating circuits $5_1$ through $5_n$ have individual CR time constsants which are different from each other. And, the number n differs depending on the characterstic of the semiconductor laser 1, and n is equal to or larger than unity. As may be easily understood, the previously described embodiment corresponds to the case where n=1. Described in detail in this connection, if the fluctuation in the light output characteristic of the semiconductor laser 1 is a combination of several kinds of curves indicated by a through c as shown in FIG. 7, a single combination of the differentiating circuit 5 and the current drawing circuit 6 could not correct the output fluctuation to a constant level, so that a plurality of combinations of the differential circuit 5 and the current drawing circuit 6 are provided corresponding to the number n of the kinds of characteristic curves to be corrected.

Figure 9:
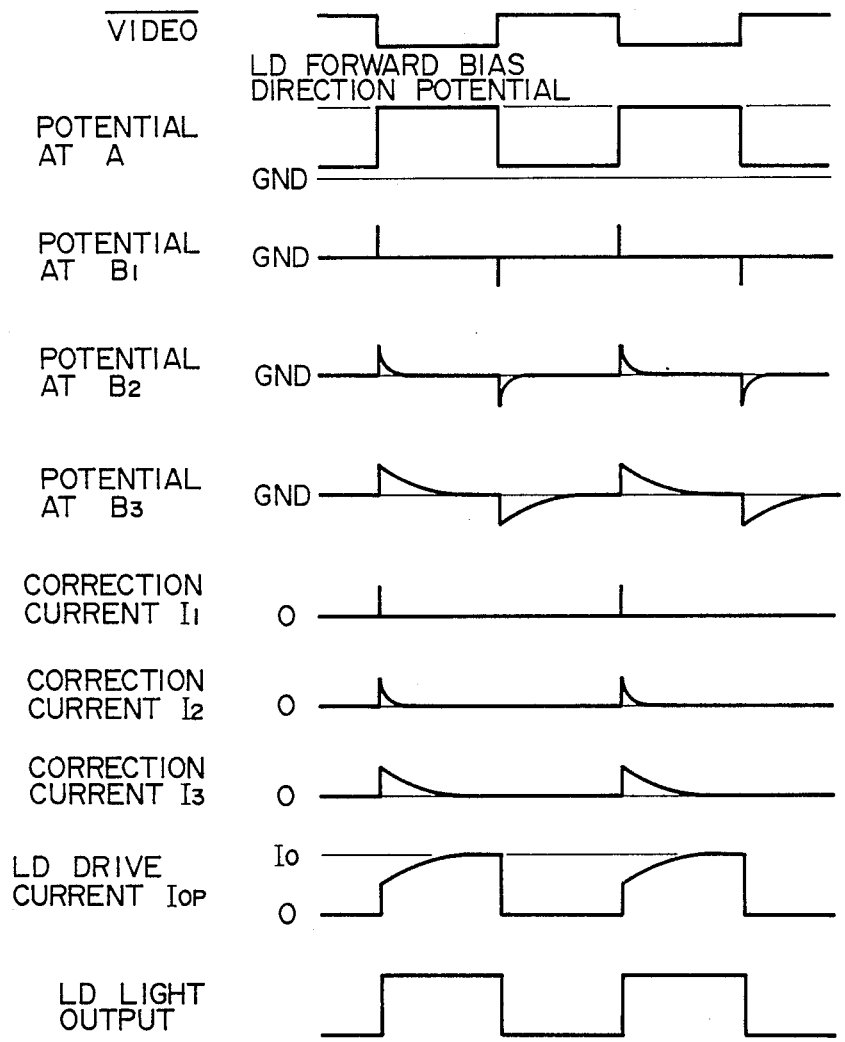
FIG. 9 is a waveform diaigram which is useful for understanding the operation of the structure shown in FIG. 8.

FIG. 8 shows a specific example for n=3 and FIG. 9 shows waveforms which are useful or understanding the operation of the structure shown in FIG. 8. The semiconductor laser output control circuit shown in FIG. 8 inclues three differentiating circuits $5_1$ through $5_3$ and three current drawing circuits $6_1$ through $6_3$, each of which has a structure shown in FIG. 3a. For example, the differentiating circuit $5_1$ includes a capacitor $C_{11}$ and a resistor $R_{11}$ and the current drawing circuit $6_1$ includes a transistor $Q_{21}$ as a main component. Similarly, the differentiating circuit $5_3$ includes a capacitor $C_{31}$ and a resistor $R_{31}$ and the current drawing current $6_3$ includes a transistor $Q_{31}$ as a main component. Besides, the CR differentiation time constants of the differentiating circuits $5_1$ through $5_3$ are set differently. Besides, in the circuit shown in FIG. 8, as a signal which forms a basis of a differential signal, the forward direction voltage of the semiconductor laser 1 produced at a node A between the semiconductor laser 1 and the constant current source 4 at the timing of turning on and off of the semiconductor laser 1 is utilized, so that there is no need to provide the phase correction circuit 3.

Figure 10:
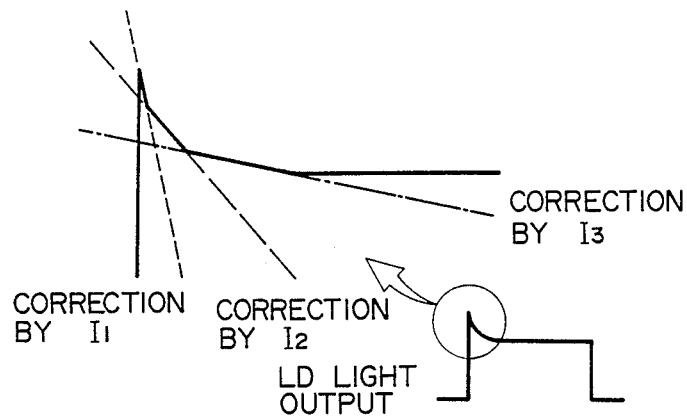
FIG. 10 is an illustration which is useful for understanding a correction of a light output in accordance ith the present invntion.

Wth such a structure described above, the voltage at node A varies in the form of a square pulse in accordance with a video signal $\overline{VIDEO}$ as a modulation signal. In this manner, the forward direction voltage produced at the node A at the time of modulation of the semiconductor laser 1 is supplied to each of the differentiating circuits $5_1$ through $5_3$, so that differential signals shown in FIG. 9 are produced at nodes $B_1$ through $B_3$ between the respective capacitors and resistors. The differential waveforms at these nodes $B_1$ through $B_3$ have different waveforms since their CR time constants differ from one another. And, thus, each of the transistors $Q_1$ through $Q_3$ draws the corresponding one of correction currents $I_1$ through $I_3$ from the constant current $I_0$, which are in proportion to the respective differential waveforms, in accordance with the positive component in the corresponding differential waveform signal. In this case also, the negative component in each of the differential waveform signals has no influence on the constant current $I_0$. As shown in FIG. 10, correction currents $I_1$ through $I_3$ are so set that a combination of these correction currents $I_1$ through $I_3$ is capable of correcting the fluctuation at the rising edge of the light output of the semiconductor laser. As a result, the time constants of the respective differentiating circuits $5_1$ through $5_3$ are so set to produce these correction currents $I_1$ through $I_3$. Thus, the LD drive current Iop flowing into the semiconductor laser 1 is a result of correction implemented by drawing three kinds of correction currents $I_1$ through $I_3$ from the constant current $I_0$ supplied from the constant current source 4. Thus corrected drive current Iop is applied to drive the semiconductor laser 1, so that the fluctuation at the rising edge of the LD light output is corrected optimally in accordance with the characteristic of the semiconductor laser 1.

Figure 11:
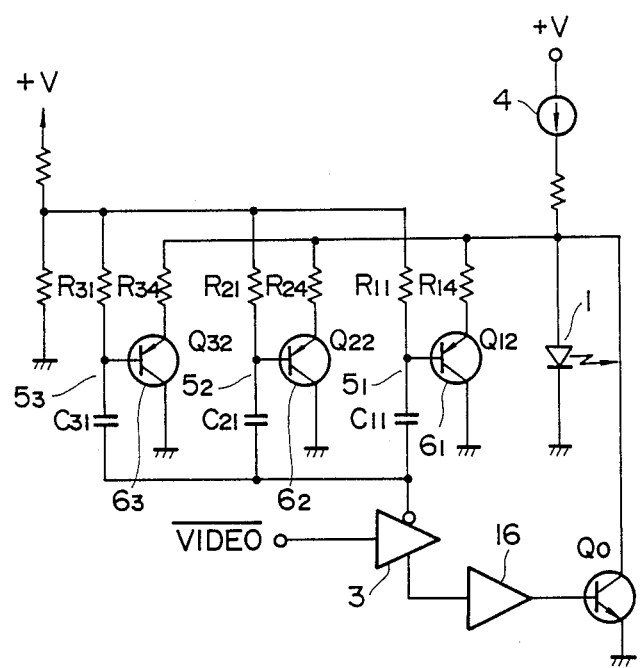
FIG. 11 is a circuit diagram showing a semiconductor laser output control apparatus constructed in accordance with a further embodiment of the present invention.

Now, referring to FIG. 11, there is shown in circuit diagram a semiconductor laser output control apparatus constructed in accordance with a further embodiment of the present invention. In the previous embodiment, the forward direction voltage of the semiconductor laser 1 based on a video signal is used as a signal defining a basis for producing a differential signal. On the other hand, in the present embodiment, a control signal to the transistor $Q_0$, which controls the on/off of the semiconductor laser 1, i.e., video signal, is used directly. In addition, for example, each of the differentiating circuits $5_1$ through $5_3$ and the current drawing circuits $6_1$ through $6_3$ in the present embodiment having the circuit structure for n=3 has a circuit structure similar to the circuit structure shown in FIG. 3b. Besides, in the present embodiment, since the response of the differentiating circuits $5_1$ through $5_3$ is extremely fast, the on/off control timing of the semiconductor laser 1 is delayed with respect to the initiation of current correction in the circuit structure having no phase correction. If such a delay becomes larger, a proper correction for the fluctuation of the light output of the semiconductor laser 1 cannot be carried out. Under the condition, in the present embodiment, use is made of the phase correction circuit 3 for obtaining a proper timing between the initiation of current correction and the lighting of the semiconductor laser 1.

Figure 12:
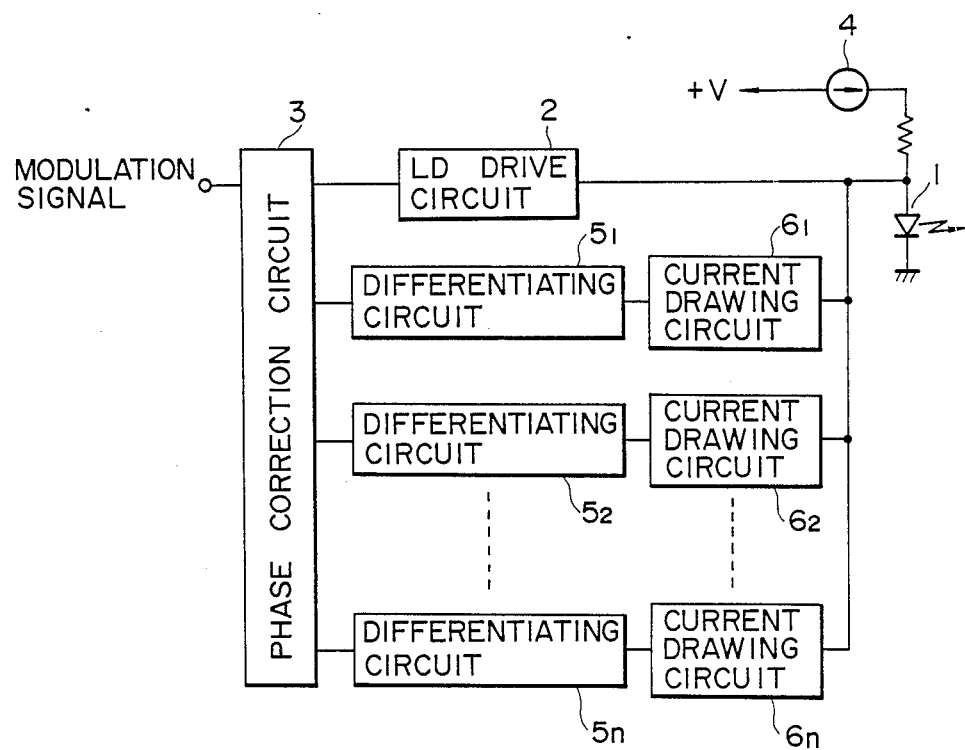
FIG. 12 is a schematic illustration showing a semiconductor laser output control apparatus constructed in accordance with a still further embodiment of the present invention.

In the case where n is equal to or larger than 2, it may be so structured that a plurality of series connections between the differentiating circuits 5 and the current drawing circuits 6 are connected to the phase correction circuit 3, thereby allowing to obtain an individual timing for each of the plurality of series connections, as shown in FIG. 12.

As described above, in accordance with the first aspect of the present invention, there is provided a semiconductor laser output control apparatus which includes a differentiating circuit for differentiating a modulation signal and a current drawing circuit for drawing correction current proportional to a differential signal output from the differentiating circuit from the constant current supplied from a constant current source. Thus, the rising edge of the drive current to be supplied to the semiconductor laser is corrected by drawing the correction current by the current drawing circuit, so that the fluctuation of light output at the rising edge due to the so-called thermal coupling of the semiconductor laser can be suppressed. Such a correction operation is carried out based on the differential waveform signal output from the differentiating circuit, a correction of a relatively short time constant, such as a few micro seconds, can be sufficiently carried out as different from the prior art control apparatus having an integrating circuit.

Figure 15:
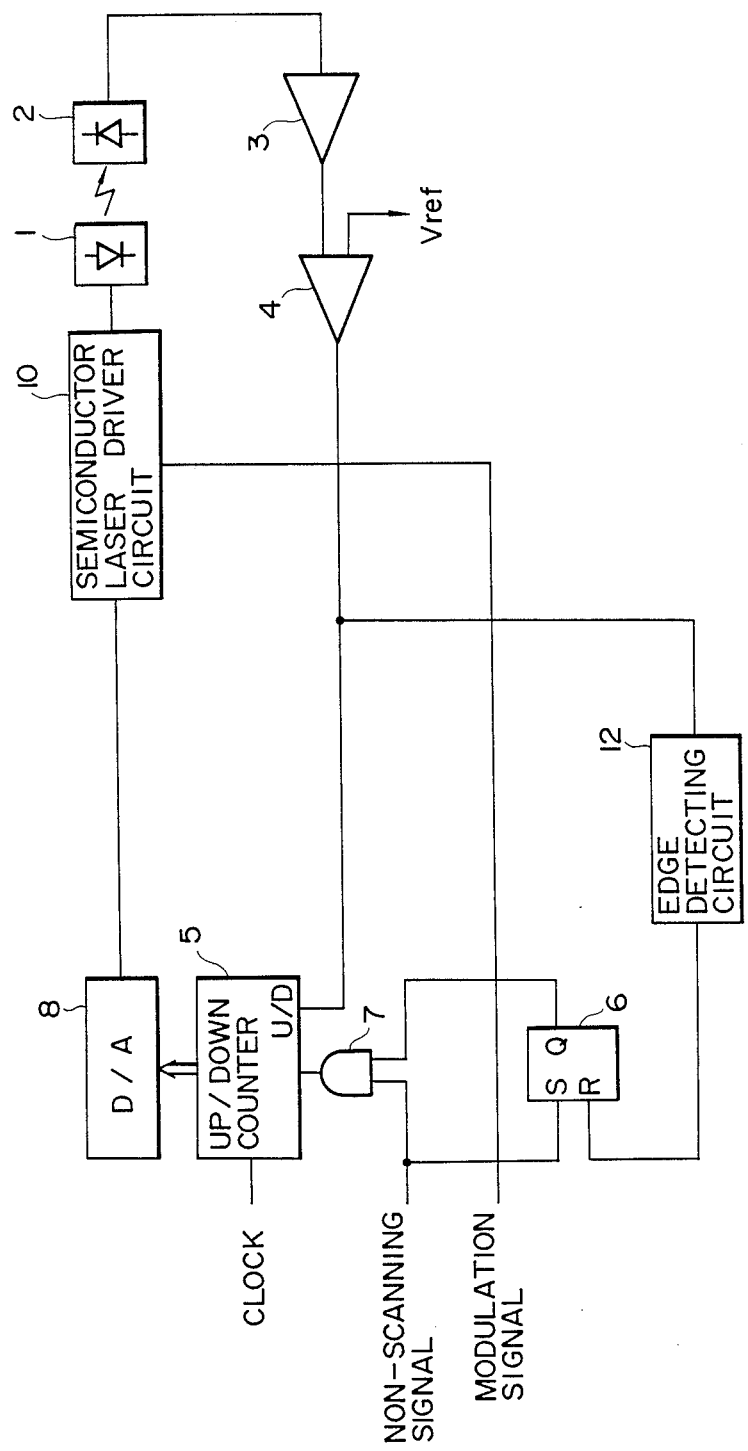
FIG. 15 is a schematic illustration showing a semiconductor laser output control apparatus constructed in accordance with a still further embodiment of the present invention.

Referring now to FIG. 15, there is shown mostly in block form a semiconductor laser output control apparatus constructed in accordance with a still further embodiment of the present invention. The illustrated apparatus includes a semiconductor laser 1 which may be used as a light source, for example, of an imaging system, such as a laser beam printer. A photo-detector 2 comprised of a photodiode is disposed to detect a light output emitted rearwardly from the semiconductor laser 1. The photodiode 2 generates current in proportion to the light output from the semiconductor laser 1, and this current is converted into a voltage by an amplifier 3, which voltage, in turn, is compared with a reference voltage $V_{ref}$ at a comparator 4. An output voltage from the comparator 4 is either at high level or at low level depending on the magnitude relationship between two input voltages to the comparator 4, and it controls the count mode of an up/down counter 5. for example, when the light ouptut from the semicoductor laser 1 is lower than the reference value, the output of the comparator 4 is at low level, so that the up/down counter 5 is set in the up-count mode. A non-scanning signal is produced when the light output of the semiconductor laser 1 does not scan a photosensitive member in a laser beam printer and it extinguishes when the light output from the semiconductor laser 1 scans the photosensitive member to form an image thereon. And the rising edge of the non-scanning signal causes a flip-flop 6 to be set. And, then, an output signal of the flip-flop 6 causes an AND gate 7 to be open and the non-scanning signal is supplied to the up/down counter 5, so that the up/down counter 5 is released from its disabled state to execute up-counting of clocks. The output of this up/down counter is converted into an analog data by a digital-to-analog converter 8 and the thus converted analog data is applied to a semiconductor laser drive circuit 10.

A modulation signal, which includes a video signal, is input into the semiconductor laser driver circuit 10, and the semiconductor laser 1 is turned on and off in accordance with this modulation signal while supplying current to the semiconductor laser 1 in accordance with an input signal. Thus, as the count of the up/down counter 5 gradually increases, the light output of the semiconductor laser 1 increases gradually, so that the output voltage of the amplifier 3 increases. During scanning of the photosensitive member, the non-scanning signal is terminated, whereby the up/down couner 5 is disabled, and the output adjustment of the semiconductor laser 1 is interrupted if not completed. And, during non-scanning time period, the non-scanning signal is produced to enable the up/down counter 5 to thereby resume the output adjustment of the semiconductor laser 1. Thereafter, when the output of the comparator 4 is inverted from the low level to the high level, an edge detecting circuit 12 detects a rising edge of the output of the comparator 4 to have the flip-flop 6 reset to thereby close the AND gate 7 so that the up/down counter 5 is returned to the disabled state. As a result, the up/down counter 5 retains the count,and,thus the magnitude of the drive current of the semiconductor laser 1 is maintained as it is.

At the time when the disabled state of the up/down counter 5 is released, if the output of the comparator 4 is at high level, the up/down counter 5 is set in the down-count mode to thereby down-count the clock. Thus, the drive current of the semiconductor laser 1 decreases and the drive output of the amplifier 3 decreases. And, if the output of the amplifier 3 becomes lower than the reference voltage $V_{ref}$ and thus the output of the comparator 4 is inverted from high level to low level, the edge detecting circuit 12 detects the rising edge of the output of the comparator 4 to have the flip-flop 6 reset, which then causes the AND gate 7 to be closed to return the up/down counter 5 to the disabled state. Accordingly, the up/down counter 5 holds the count and thus the magnitude of the drive current for the semiconductor laser 1 is maintained. Alternatively, it may also be so structured that the edge detecting circuit 12 causes the flip-flop 6 to be reset only when the output of the comparator 4 is inverted from low level to high level.

Figure 16:
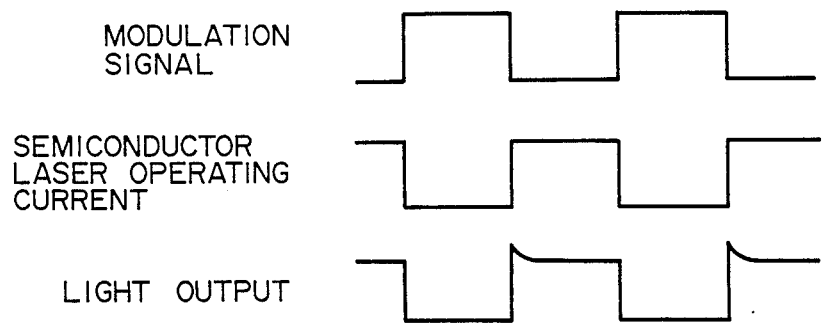
FIGS. 16 and 17 are waveform diagrams which are useful for understanding the operation of the apparatus shown in FIG. 15.
Figure 17:
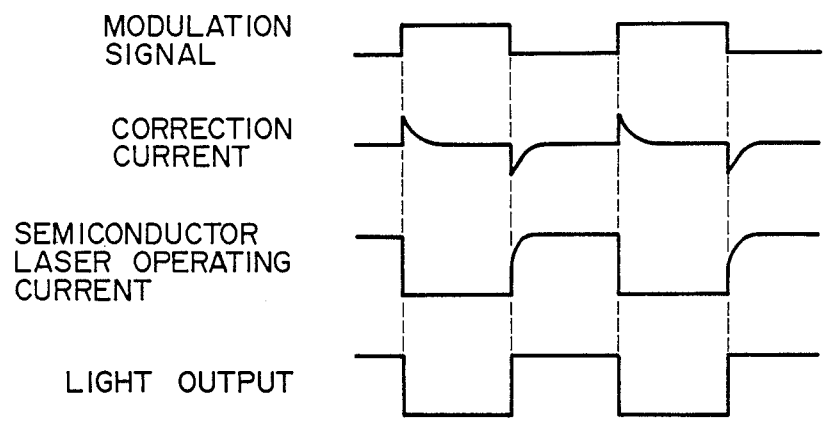

FIG. 16 illustrates the output condition of the semiconductor laser in the above-described semiconductor laser output control apparatus and the fluctuation in the light output of the semiconducor laser is indicated. And, FIG. 17 illustrates the output condition of the semiconductor laser in a semiconductor laser output control apparatus provided with a correction means in accordance with one embodiment of the present invention. In FIG. 17, the fluctuation in the light output of the semiconductor laser is corrected.

Figure 18:
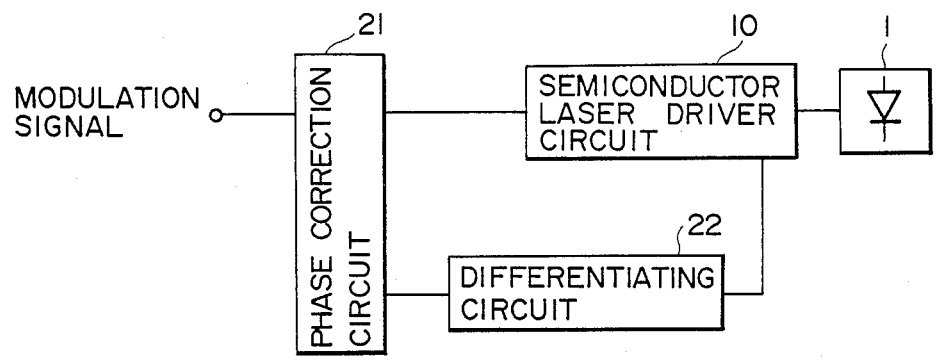
FIGS. 18 through 20 are block diagrams showing several additional embodiments of the present semiconductor laser output control apparatus.
Figure 19:
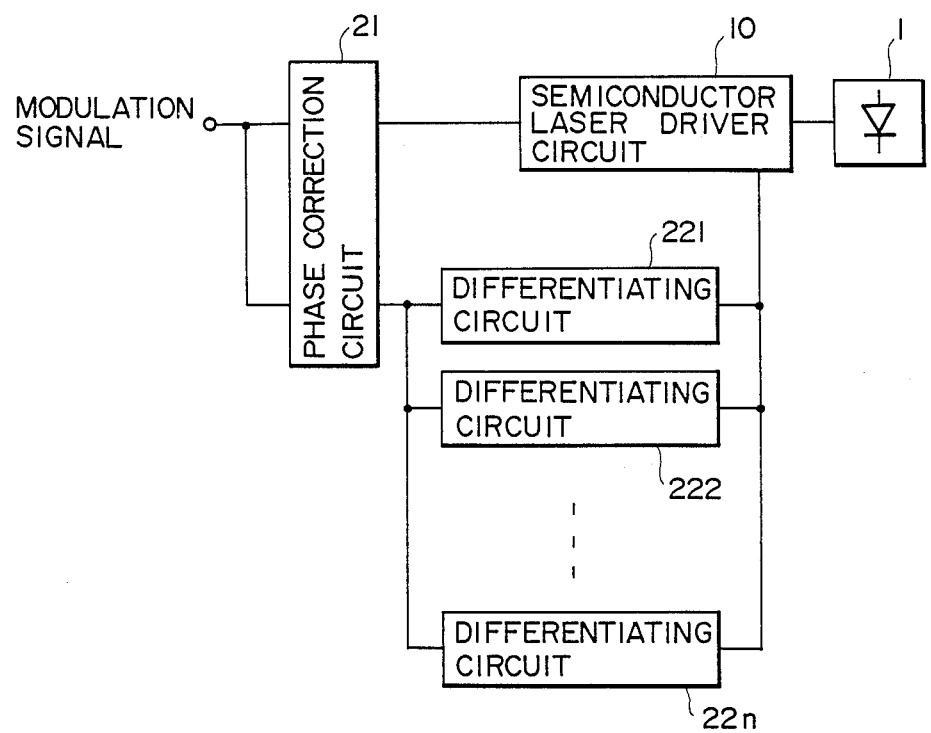
Figure 20:
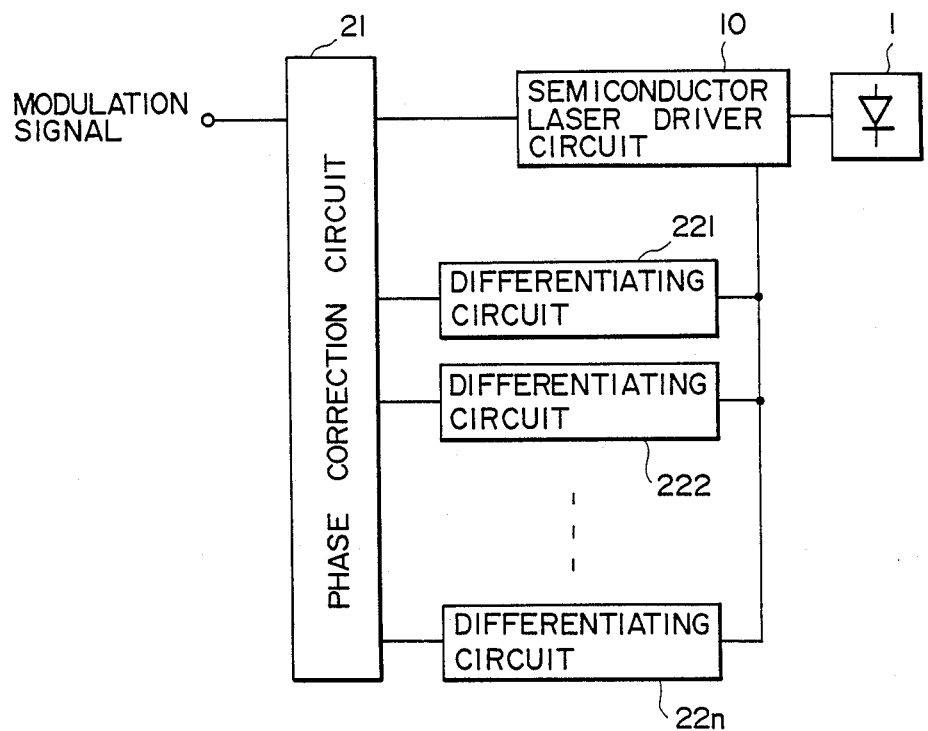

FIGS. 18 through 20 illustrate several correcting means constructed in accordance with various embodiments of the present invention. For example, the correcting means shown in FIG. 18 includes a phase correction circuit 21 and a differentiating circuit 22, and the phase correction circuit 21 is to adjust the timing to provide correction for the emission of light (light output) of the semiconductor laser 1, so that it is provided only when timing adjustment is required. The differentiating circuit 22 differentiates a modulation signal input into the semiconductor laser drive circuit 10 to thereby supply correction current of a predetermined time constant to the semiconductor laser 1 at the time when the semiconductor laser 1 is turned on, whereby the output fluctuation of the semiconductor laser 1 is corrected.

Figure 21:
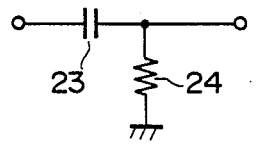
FIGS. 21 through 23 are circuit diagrams showing several examples of a differentiating circuit suitable for use in the present semiconductor laser output control apparatus.
Figure 22:
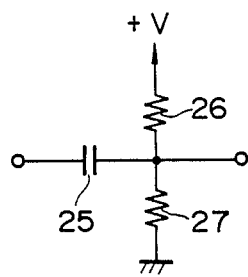
Figure 23:
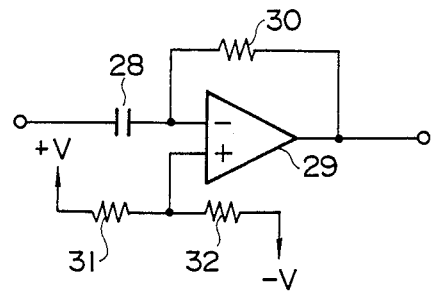

In the case where the output characteristic of a semiconductor laser to be corrected has n kinds of time constants, where n is larger than unity, a plurality of differentiating circuits 22 and 221 through 22n, corresponding to the n kinds of time constants and correction amounts, may be provided in parallel, as shown in FIGS. 19 and 20. As shown in FIG. 21, each of the differentiating circuits 22 and 221 through 22n may be comprised of a capacitor 23 and a resistor 24, as shown in FIG. 21, comprised of a capacitor 25 and resistors 26 and 27, as shown in FIG. 22, or comprised of a capacitor 28, an operational amplifier 29 and resistors 30 through 32, as shown in FIG. 23.

Figure 24:
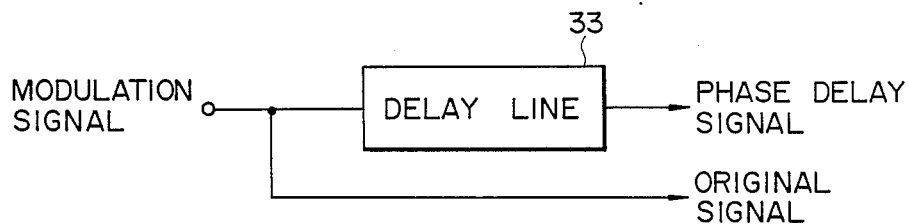
FIGS. 24 through 27 are schematic illustrations showing several examples of a phase correcting circuit.
Figure 25:
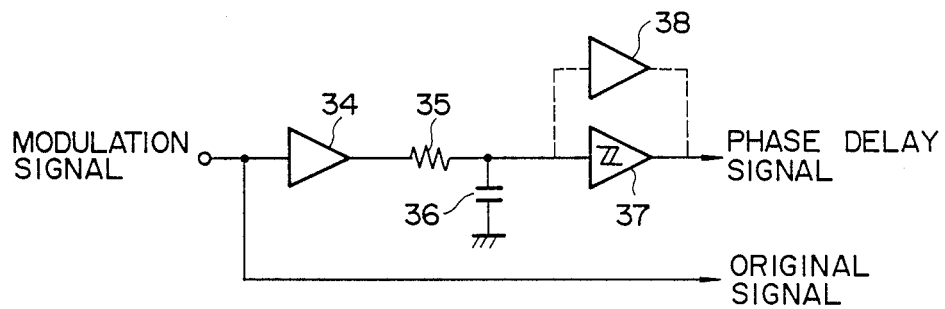
Figure 26:
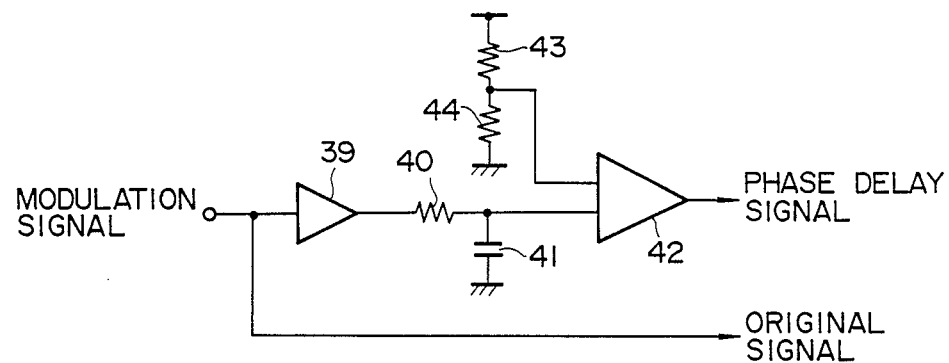
Figure 27:
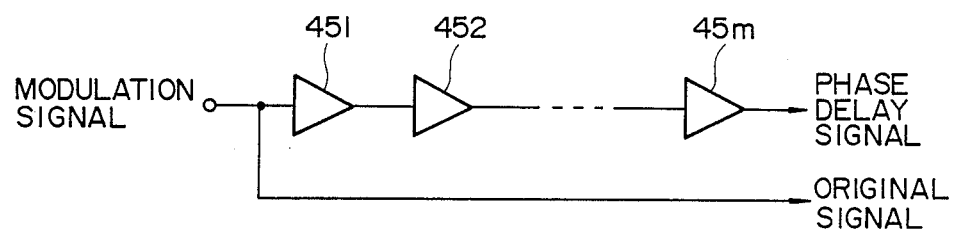

In the present embodiment, a modulation signal in differentiated by the differentiating circuits 22 and 221 through 22n to produce correction currents which are used to correct the output fluctuation of the semiconductor laser and at the same time the semiconductor laser 1 is turned on/off by the modulation signal. Thus, there are provided two separate systems: system A for correcting the output fluctuation of the semiconductor laser and system B for turning the semiconductor laser on/off. Therefore, there is a chance that the activation timing of the semiconductor laser does not agree with the correction timing for the output fluctuation. When this discrepancy becomes larger, a proper correction for the output fluctuation of the semiconductor laser cannot be carried out, so that a proper timing between the initiation of correction for the output fluctuation of the semiconductor laser and the activation of the semiconductor laser is adjusted by the phase correction circuit 21. For example, as shown in FIG. 24, it may also be so structured that the phase correction circuit 21 causes the modulation signal to be delayed by a delay line 33 to produce an input signal (phase delay signal) to the system A, and, on the other hand, the modulation signal is directly input into the system B as its input signal (original signal). Besides, the phase correction circuit 21 may be defined by a buffer 34, a resistor 35, a capacitor 36, and a Schmidt trigger circuit 37 (or buffer 38) as shown in FIG. 25, or alternatively by a buffer 39, a resistor 40, a capacitor 41, a comparator 42, and resistors 43 and 44 as shown in FIG. 26, or further alternatively by a plurality of buffers 451 through 45n as shown in FIG. 27.

Figure 13:
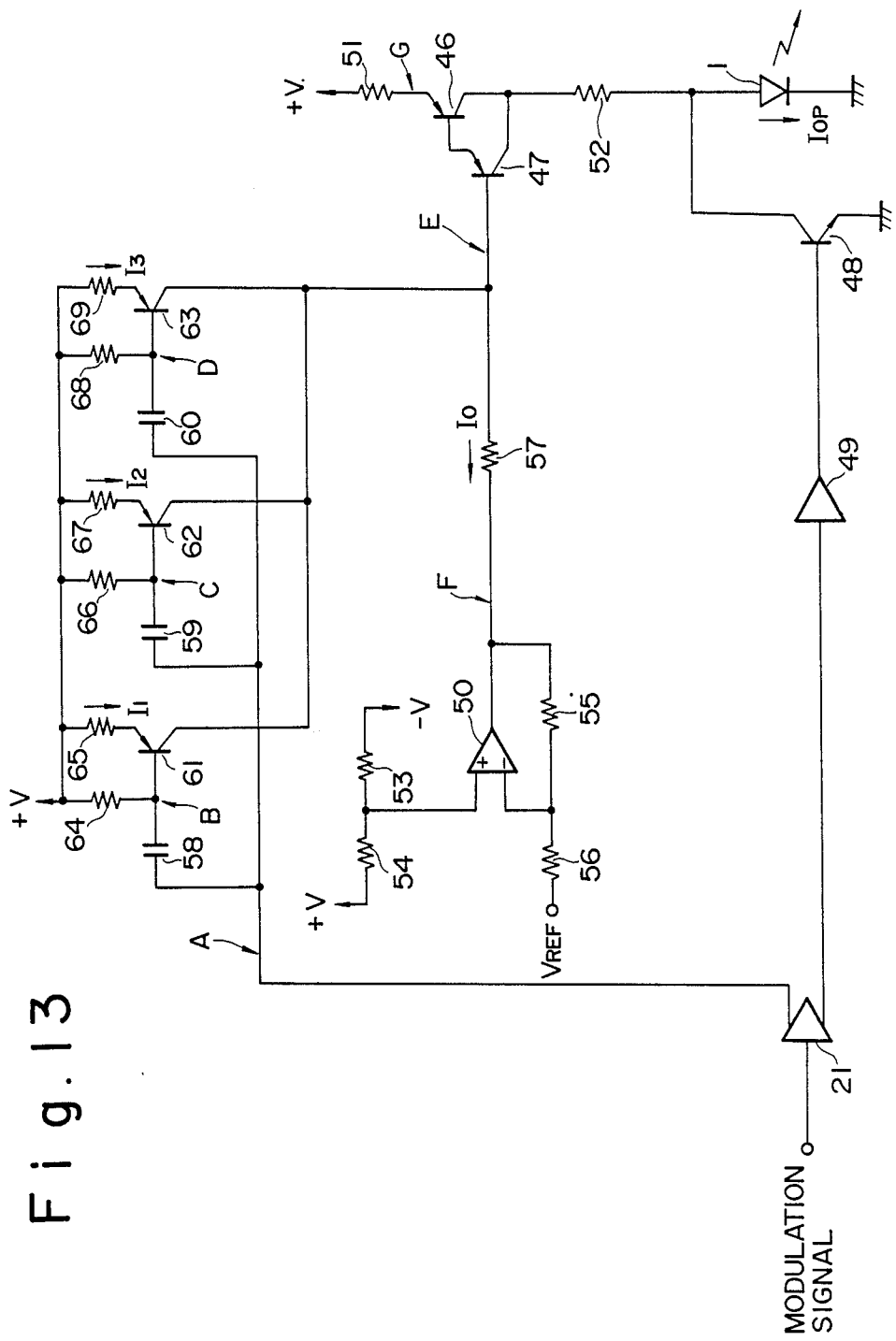
FIG. 13 is a circuit diagram showing a semiconductor laser output control apparatus constructed in accordance with a still further embodiment of the present invention.

FIG. 13 shows a semiconductor laser output control apparatus constructed in accordance with one embodiment of this aspect of the present invention. As shown, the present apparatus includes a phase correction circuit 21, differentiating circuits 221 through 223, transistors 46 through 48, a buffer 49, an operational amplifier 50, and resistors 51 through 57. And, the transistors 46 through 48, buffer 49, operational amplifier 50 and resistors 51 through 57 define a semiconductor laser driver circuit 10. The differentiating circuits 221 through 223 are constructed by capacitors 58 through 60, transistors 61 through 63 and resistors 64 through 69, respectively, and a modulation signal is supplied to the semiconductor laser driver circuit 10 and also to the differentiating circuitis 221 through 223 with its phase relationship adjusted appropriately by the phase correction circuit 21. The differentiating circuits 221 through 223 cause the modulation signal from the phase correction circuit 21 to be differentiated to thereby produce correction signals having different time constants, which are then supplied to the semiconductor laser driver circuit 10. At the semiconductor laser driver circuit 10, the modulation signal from the phase correction circuit 21 is applied to the base of the transistor 48 through the buffer 49 to thereby cause the semiconductor laser 1 to be turned on/off, and, at the same time, the drive current is supplied by the transistors 46 and 47 to the semiconductor laser 1 when it is turned on. And, this drive current is corrected by the correction current supplied to the base of the transistor 47 from the differentiating circuits 221 through 223.

In the present embodiment, the drive current Iop of the semiconductor laser 1 may be expressed by the following equation with the designation of the power supply voltage by V and the resistance of the resistor 51 by $R_2$.

$$Iop = (V - \text{voltage at node G})/R_2$$

Figure 14:
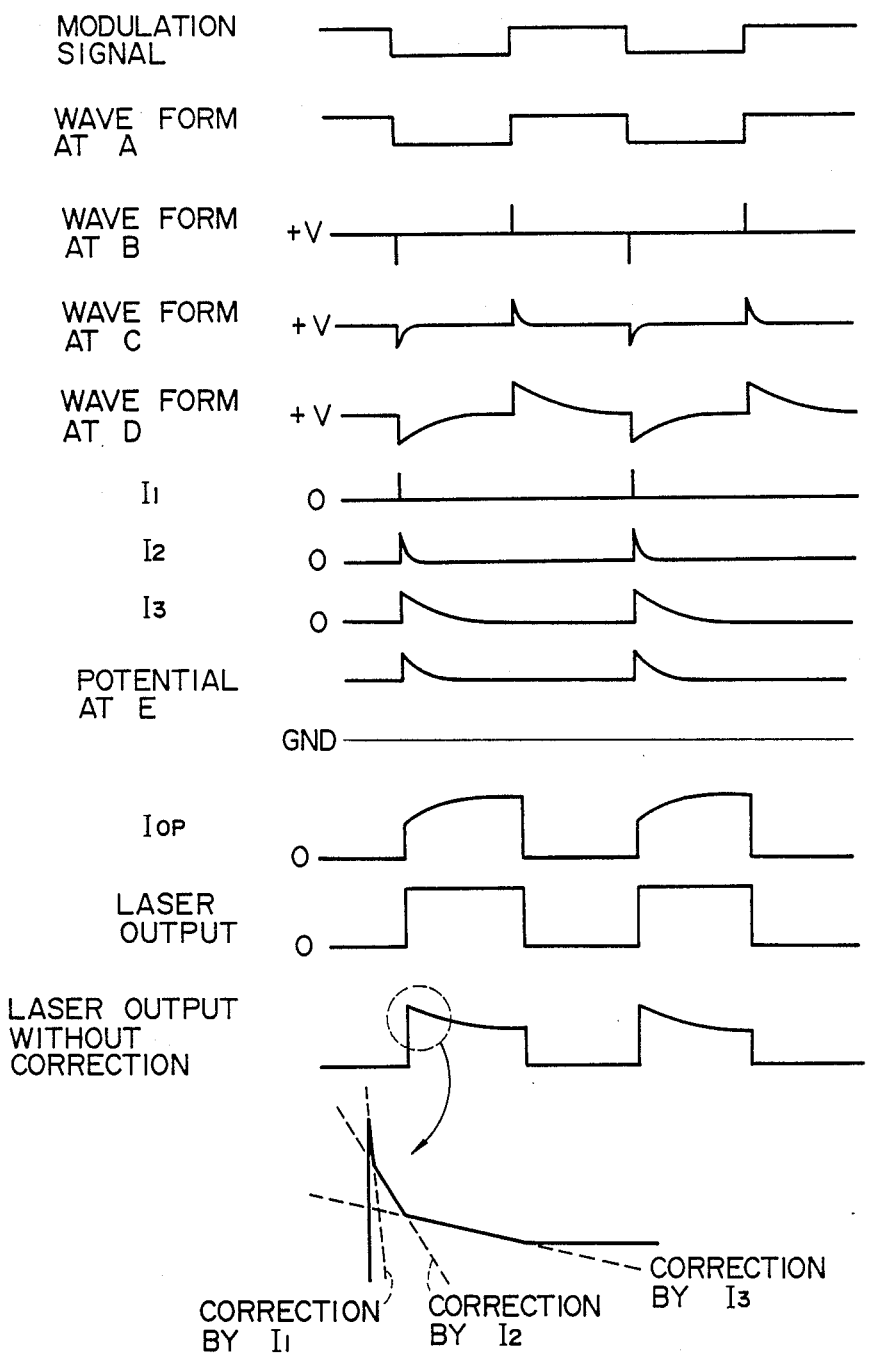
FIG. 14 is a waveform diagram which is useful for understanding the operation of the apparatus shown in FIG. 13.

The voltage at node G can be given by (voltage at node $F + I_0 R_1 +$ voltage between EG), designating the resistance of the resistor 57 by $R_1$ and the current flowing through the resistor 57 by $I_0$. Based on the modulation signal at node A, sigals having differential waveforms having time constants determined by the resistors 64, 66 and 68 and the capacitors 58 through 60, respectively, of the respective differentiating circuits 221 through 223 are produced at respective nodes B, C and D. Then, based on the negative components of these signals thus produced, the transistors 61 through 63 cause currents $I_1$ through $I_3$, which are in proportion to the respective signals, to flow to node E; on the other hand, the positive components of these signals cause the transistors 61 through 63 to be cut off so that no influence is produced. The currents $I_1$ through $I_3$ flowing into the node E causes $I_0$ to increase to thereby increase the voltage at node G while causing Iop to decrease. As may be understood from the waveforms shown in FIG. 14, each of the currents $I_1$ through $I_3$ has a particular time constant and current level so as to correct a particular portion of the fluctuation, which varies in slope, present at and right after the rising edge of the output of the semiconductor laser 1 without correction. As a result, the output fluctuation of the semiconductor laser 1 is suppressed.

Figure 28:
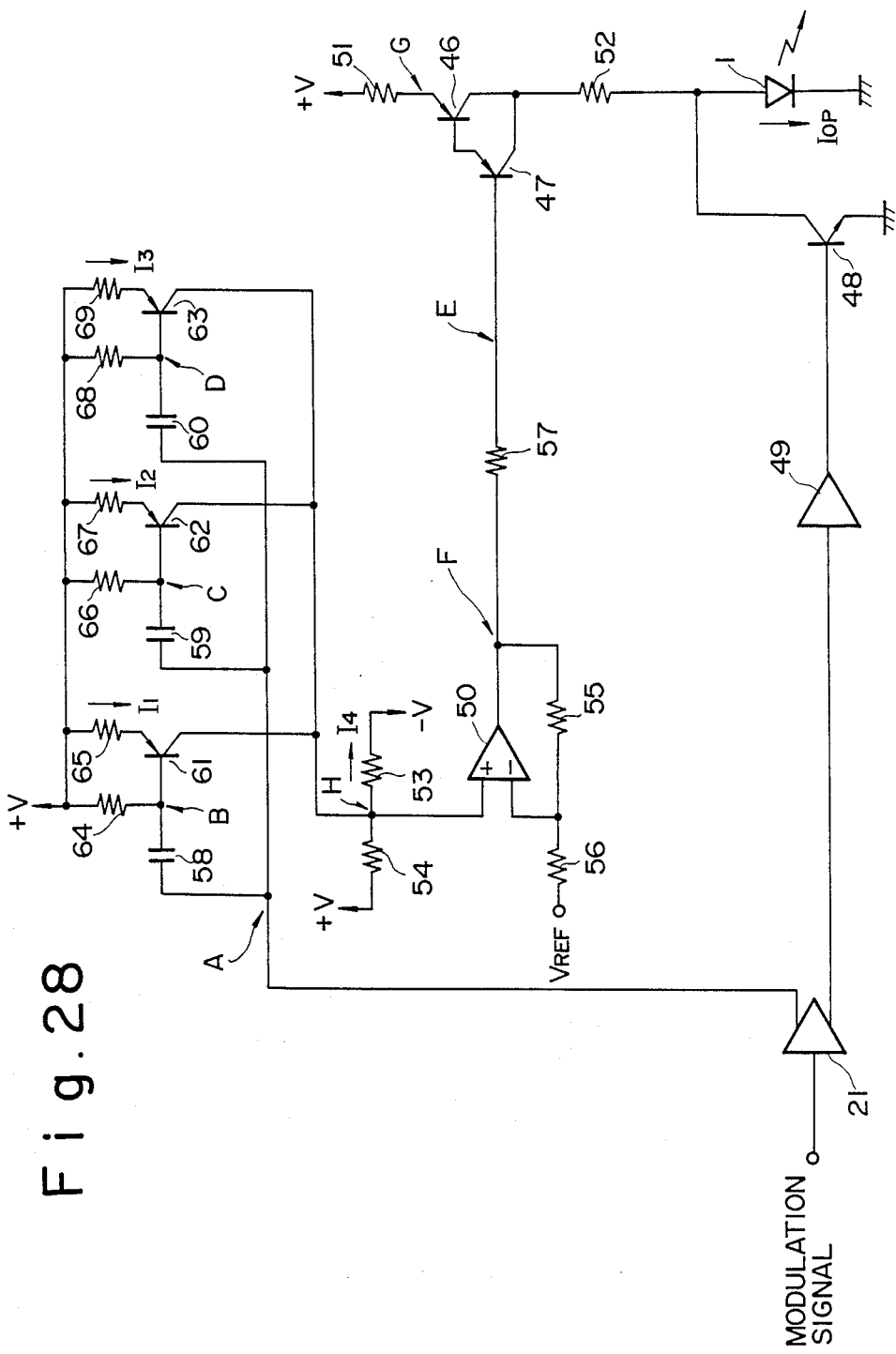
FIGS. 28 and 29 are circuit diagrams showing other embodiments of the present semiconductor laser output control apparatus.

FIG. 28 shows another embodiment of this aspect of the present invention. In the present invention, correction currents $I_1$ through $I_3$ from the differentiating circuits 221 through 223 flow into a node H to thereby increase the current $I_4$ through the resistor 53 and the voltage increases at nodes H, F and G while Iop decreases. The respective currents $I_1$ through $I_3$ have respective time constants and current levels so as to correct the corresponding portions of the fluctuation in the non-corrected output from the semiconductor laser 1.

Figure 29:
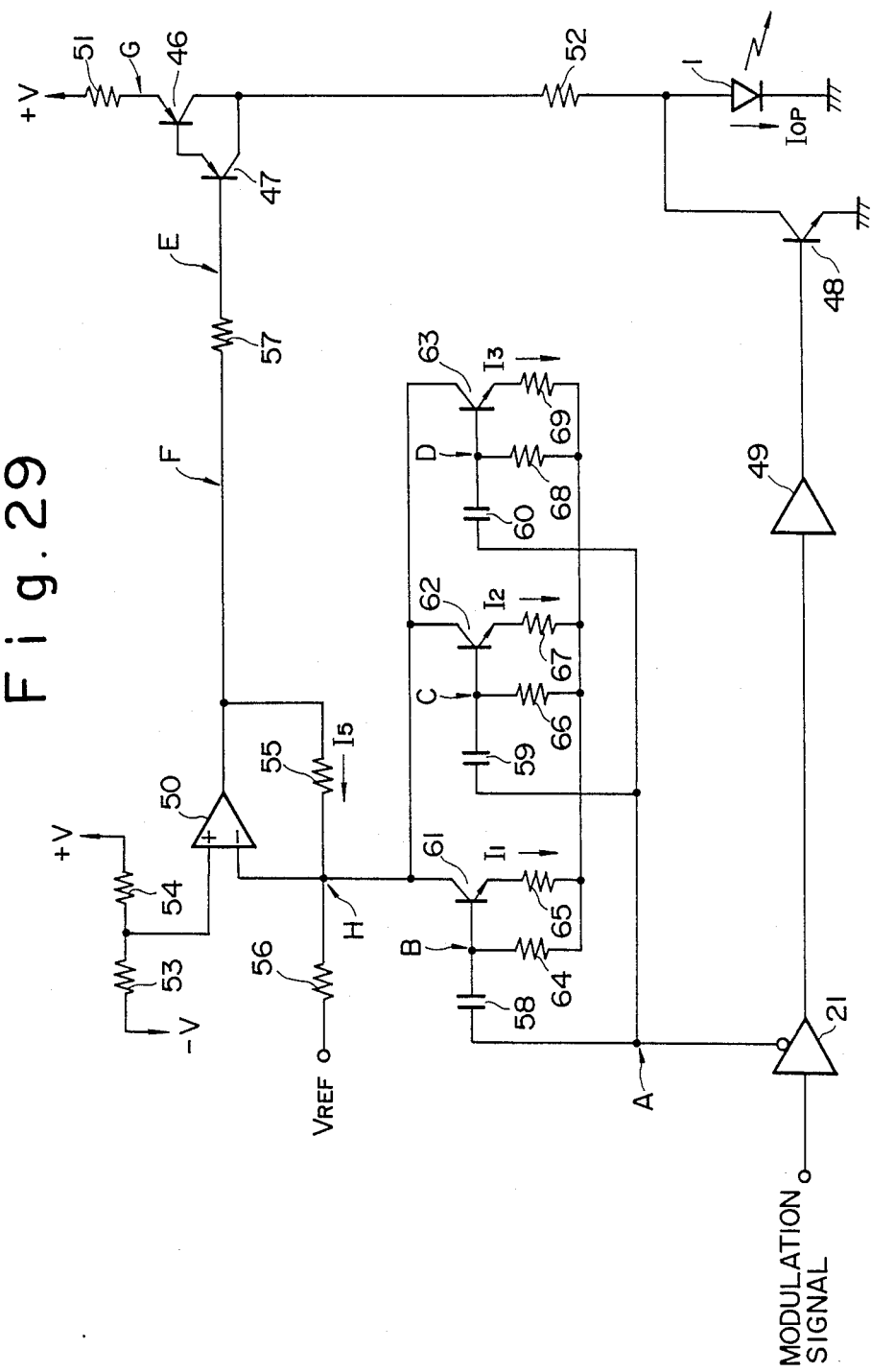

FIG. 29 shows a further embodiment of this aspect of the present invention. In this embodiment, correction currents $I_1$ through $I_3$ from the differentiating circuits 221 through 223 flow into the node H to thereby increase the current $I_5$ through the resistor 55, and the voltage increases at nodes F and G; whereas Iop decreases. The respective currents $I_1$ through $I_3$ have respective time constants and current levels so as to correct the corresponding portions of the fluctuation in the non-corrected output from the semiconductor laser 1.

As described above, in accordance with the second aspect of the present invention, correction current of a predetermined time constant is supplied to a semiconductor laser while the semiconductor laser is turned on, thereby correcting the output fluctuation of the semiconductor laser, so that the output fluctuation due to the so-called thermal coupling of the semiconductor laser can be suppressed at low cost and by a simple circuit.

While the above provides a full and complete disclosure of the preferred embodiments of the present invention, various modifications, alternate constructions and equivalents may be employed without departing from the true spirit and scope of he invention. Therefore, the above description and illustration should not be construed as limiting the scope of the invention, which is defined by the appended claims.

What is claimed is:

1. An apparatus for controlling the output of a semiconductor laser comprising:
   a semiconductor laser;
   driving means for driving said semiconductor laser by supplying drive current thereto;
   a constant current source connected in series with said semiconductor laser for supplying constant current to said semiconductor laser;
   a switching element connected in parallel with said semiconductor laser, said switching element being turned on and off in accordance with a modulation signal;
   a differentiating circuit means for differentiating said modulation signal to thereby produce a differential signal; and
   a current drawing circuit means for drawing correction current from said constant current source at a rising edge of said drive current so as to control an output of said semiconductor laser, said correction current being proportional to said differential signal output from said differentiating circuit.

2. The apparatus of claim 1, wherein said differentiating circuit includes a capacitor having a first plate connected to receive said modulation signal and a second plate connected to said current drawing circuit and a first resistor connected between said second plate of said capacitor and a first reference potential.

3. The apparatus of claim 2, wherein said differentiating circuit further includes a second resistor connected between said second plate of said capacitor and a second reference potential.

4. the apparatus of claim 1, wherein said differentiating circuit includes a capacitor having a first plate connected to receive said modulation signal and a second plate, an operational amplifier having a first input terminal connected to said second plate of said capacitor, a second input terminal connected to receive a third reference potential and an output terminal connected to said current drawing circuit, and a first resistor connected between said first input and output terminals of said operational amplifier.

5. The apparatus of claim 4, wherein said differentiating circuit further includes second and third resistors which are connected in series between a pair of fourth and fifth reference potentials, a junction between said second and third resistors being connected t said second input terminal of said operational amplifier.

6. The apparatus of claim 1, wherein said current drawing circuit includes a bipolar transistor having a first electrode connected to said semiconductor laser, a second electrode connected to receive said differential signal output from said differentiating circuit and a third electrode connected to said first reference potential.

7. The apparatus of claim 6, wherein said bipolar transistor is an NPN transistor.

8. The apparatus of claim 6, wherein said bipolar transistor is a PNP transistor.

9. The apparatus of claim 6, wherein said current drawing circuit further includes a resistor connected between said third electrode and said first reference potential.

10. A system for controlling the output of a semiconductor laser comprising:
    a semiconductor laser for emitting coherent light;
    switching means for switching said semiconductor laser to be turned on and off in accordance with a modulation signal applied to said semiconductor laser so as to maintain a substantially constant coherent light output said semiconductor laser; and
    correcting means for correcting an output fluctuation in the light emitted from said semiconductor laser by supplying correction current of a predetermined time constant to said semiconductor laser when saidi semiconductor laser is turned on.

11. The system of claim 10, wherein said output fluctuation occurs at a rising edge when said laser is turned on.

12. The system of claim 10, wherein said correction current has a plurality of time constants.

* * * * *